United States Patent
Morii

(10) Patent No.: US 8,124,250 B2
(45) Date of Patent: Feb. 28, 2012

(54) ORGANIC ELECTRONIC DEVICE

(75) Inventor: Katsuyuki Morii, Fukuoka (JP)

(73) Assignee: Seiko Epson Corporation, Tokyo (JP)

( * ) Notice: Subject to any disclaimer, the term of this patent is extended or adjusted under 35 U.S.C. 154(b) by 471 days.

(21) Appl. No.: 12/151,850

(22) Filed: May 8, 2008

(65) Prior Publication Data

US 2008/0280162 A1 Nov. 13, 2008

(30) Foreign Application Priority Data

May 11, 2007 (JP) ................................ 2007-126437

(51) Int. Cl.
*H01L 51/54* (2006.01)
*B05D 5/12* (2006.01)

(52) U.S. Cl. ........ 428/690; 428/917; 313/504; 313/506; 427/66; 257/40

(58) Field of Classification Search .................. None
See application file for complete search history.

(56) References Cited

U.S. PATENT DOCUMENTS

| | | | |
|---|---|---|---|
| 7,387,904 B2 * | 6/2008 | Saito et al. | 438/29 |
| 2004/0178414 A1 | 9/2004 | Frey et al. | |
| 2005/0249974 A1 * | 11/2005 | Mori et al. | 428/690 |
| 2006/0199037 A1 | 9/2006 | Morii | |
| 2007/0243416 A1 * | 10/2007 | Watanabe et al. | 428/704 |

FOREIGN PATENT DOCUMENTS

| | | |
|---|---|---|
| JP | 2000-223276 | 8/2000 |
| JP | 2004-527093 | 9/2004 |
| JP | 2006-245329 | 9/2006 |
| JP | 2007-053286 | 3/2007 |
| WO | WO 2005/115995 A1 * | 12/2005 |

OTHER PUBLICATIONS

"Interface—Definition of interface at YourDictionary.com." yourdictionary.com. yourdictionary.com, n.d. Web. Jan. 26, 2011. <http://www.yourdictionary.com/interface>.*
StoBel, et al., "Electron Injection and Transport in 8-Hydroxyquinoline Aluminum," Synthetic Metals, 111-112, pp. 19-24 (2000).
Gustafsson, et al., "Flexible Light-Emitting Diodes Made from Soluble Conducting Polymers," Nature, 357:477-479 (1992).

* cited by examiner

*Primary Examiner* — Dawn L. Garrett
(74) *Attorney, Agent, or Firm* — Nutter McClennen & Fish LLP; John J. Penny, Jr.; Christina M. Sperry

(57) ABSTRACT

An organic electronic device includes: a pair of electrodes, an organic film layer containing an organic substance having a benzothiadiazole skeleton, a metal oxide layer provided on the organic film layer by vacuum vapor deposition, and an interface formed between the pair of electrodes out of the organic film layer and the metal oxide layer.

11 Claims, 3 Drawing Sheets

US 8,124,250 B2

ORGANIC ELECTRONIC DEVICE

The entire disclosure of Japanese Patent Application No. 2007-126437, filed May 11, 2007 is expressly incorporated by reference herein.

BACKGROUND

1. Technical Field

The present invention relates to an organic electronic device and a method for manufacturing the same.

2. Related Art

Numerous researches are being conducted on organic electronic devices such as organic light emitting devices (LEDs) and organic thin film transistors (TFTs). In current techniques, however, it is necessary to select materials having energy levels appropriate for carrier injection from an electrode to an organic substance. This is based on an idea that the energy level of a material in a film used in the development of inorganic semiconductor devices is considered as a continuum band and that the junction is performed with sending and receiving of the carriers. For example, an organic LED requires an electrode appropriate for the highest occupied molecular orbital (HOMO) level and the lowest unoccupied molecular orbital (LUMO) level of the organic molecule. As a result, an active metal having a low work function needs be used on the cathode side (Non-Patent Document 1: *Nature*, vol. 357, p. 477, 1992). This requires a sealing structure which is a heavy burden in applications.

The amount of carrier injection is strongly influenced by the height of a barrier. Thus, with devices such as TFTs associated with the carrier injection, once a central organic semiconductor is determined, ingredients such as electrodes that turn the semiconductor into a device are automatically determined (Non-Patent Document 2: *Synthetic Metals*, vol. 111-112, p. 19, 2000). This greatly restricts an act of adding functional variety to the device or adding other functions to the device.

SUMMARY

An advantage of the invention is to provide an interface that allows abundant carriers to be injected from an electrode to an organic film, without depending on the energy level of the material of the organic film.

According to a first aspect of the invention, an organic electronic device includes: a pair of electrodes, an organic film layer containing an organic substance having a benzothiadiazole skeleton, a metal oxide layer provided on the organic film layer by vacuum vapor deposition, and an interface formed between the pair of electrodes out of the organic film layer and the metal oxide layer.

In this case, abundant carriers may be injected from the electrode to the organic film layer without depending on the energy level of the organic film material.

It is preferable that the metal oxide be a molybdenum oxide.

In this case, because a hole injection efficiency increases, more abundant carriers may be injected from the electrode to the organic film layer.

It is also preferable that the metal oxide be a vanadium oxide.

In this case, because the hole injection efficiency increases, more abundant carriers may be injected from the electrode to the organic film layer.

It is preferable that the organic electronic device be an organic film light emitting device.

Use of such a light emitting device may provide an atmospherically stable light emitting display without the sealing.

According to a second aspect of the invention, a method for manufacturing an organic electronic device includes: providing a first film layer made of an organic substance having a benzothiadiazole skeleton, and providing on the first film a second film layer made of a metal oxide by vacuum vapor deposition.

By this manufacturing method, a metallic complex having the Fermi level is produced due to the benzothiadiazole skeleton and the metal oxide. It is therefore possible to provide an organic electronic device that allows abundant carrier injection to the organic film layer.

It is preferable that the metal oxide be a vanadium oxide.

In this case, because the hole injection efficiency increases, more abundant carriers may be injected from the electrode to the organic film layer.

It is also preferable that the metal oxide be a molybdenum oxide.

In this case, because the hole injection efficiency increases, more abundant carriers may be injected from the electrode to the organic film layer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described.

Figure 1:
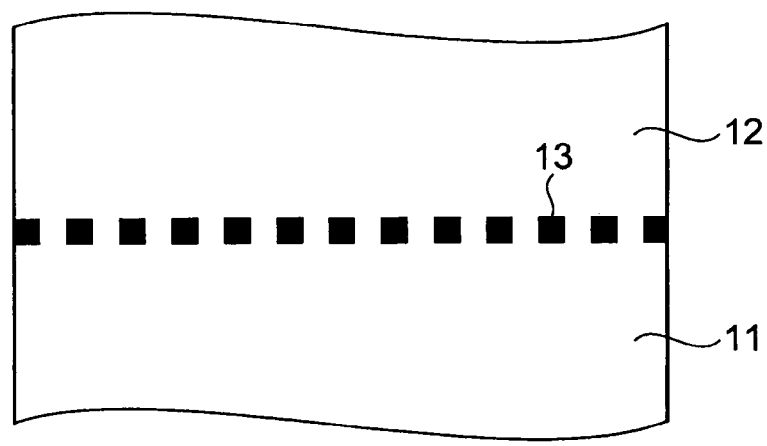
FIG. 1 is a pattern diagram showing the longitudinal plane of an exemplary of an interface as presented in embodiments of the invention.

FIG. 1 is a pattern diagram showing the longitudinal plane of an interface located in an organic film electrode device of the embodiments of the invention. Referring to FIG. 1, an interface 13 is interposed between an organic film layer 11 and an upper metal oxide layer 12. The organic film layer 11 indicates a first film layer as mentioned in the claims, and the upper metal oxide layer 12 indicates a second film layer as mentioned in the claims.

The organic film layer 11 contains at least one kind of organic material having a benzothiadiazole skeleton (hereafter referred to as a "BT unit"). Examples of the organic material having the BT unit include:

poly(dioctylfluorene-alt-benzothiadiazole) (F8BT),
poly(N-dodecyl-2,5-bis(2'-thienyl)pyrrol-2,1,3-benzothiadiazole) (PTPTB, refer to: C. J. Brabec et. al., *Adv Func. Mater.* 12, 709, 2002),
4,7-diphenyl-benzo[1,2,5]thiadiazole (F1),
4,7-bis-biphenyl-4-yl-benzo[1,2,5]thiadiazole (F2),
4,7-di(4-methoxy-phenyl)-benzo[1,2,5]thiadiazole (F3), 4,7-bis-(6-methoxyl-naphthalene-2-yl)-benzo[1,2,5]thiadiazole (F4), 4,7-di(2,3-dihydro-thieno[3,4-b][1,4]dioxin-5-yl)-benzo[1,2,5]thiadiazole (F5), 4,7-di(4-(N,N-dimethylamino)-phenyl)-benzo[1,2,5]thiadiazole (F6) (for F1 to F6, refer to: Dmitry Aldakov et. al., *Chem. Mater.* 17, 5238-5241, 2005), 4,7-bis[5-(4'-trifluoromethylphenyl)thiophene-2-yl]benzo[1,2,5]thiadiazole (1) (for (1), refer to: Takahiro Kono et. al., *Chem. Mater.* 19, 1218-1220, 2007), 4,7-bis(4-dimethylaminophenyl)-2,1,3-benzothiadiazole (2), 4-(4-dimethylaminophenyl)-7-(4-diphenylaminophenyl)-2,1,3-banzothiadiazole (3), 4,7-bis(4-diphenylaminophenyl)-2,1,3-benzothiadiazole (4), 4,7-bis{4-[N-(1-naphthyl)-N-phenylamino]phenyl}-2,1,3-benzothiadiazole (5), 4,7-bis{4-[N-(2-naphthyl)-N-phenylamino]phenyl}-2,1,3-benzothiadiazole (6), 4,7-bis(4'-diphenylaminophenyl-4-yl)-2,1,3-benzothiadiazole (7), 4,7-bis{5-[4-(diphenylamino)phenyl]-2-thienyl}-2,1,3-benzothiadiazole (8), 4,7-bis{2-[4-(diphenylamino)phenyl]ethenyl}-2,1,3-benzothiadiazole (9), 4,7-bis{2-[4-(diphenylamino)phenyl]ethynyl}-2,1,3-benzothiadiazole (10) (for (2) to (10), refer to: Shin-ichiro Kato et. al., *Chem. Commun.* 2342-2343, 2004) and any derivative thereof, and 2,1,3-benzothiadiazole.

Examples of other organic materials to be mixed, other than the BT unit, are high molecular weight materials (light emitting materials, electron transport materials, hole transport organic materials) that function as the electronic device, or low molecular weight materials (light emitting materials, electron transport materials, hole transport organic materials), but not limited thereto.

In other words, the organic materials usable for the organic film layer 11 are: combinations of the organic material containing the BT unit and a plurality of high molecular weight materials (light emitting materials, electron transport materials, hole transport organic materials), combinations of the organic material containing the BT unit and a plurality of low molecular weight materials (light emitting materials, electron transport materials, hole transport organic materials), or organic materials containing the BT unit uncombined with other materials.

Examples of the high molecular weight light emitting materials or electron transport materials include: polyacetylene-based compounds such as trans-type polyacetylene, cis-type polyacetylene, poly(di-phenylacetylene) (PDPA), and poly(alkyl, phenylacetylene) (PAPA); polyparaphenylenevinylene-based compounds such as poly(para-phenylenevinylene) (PPV), poly(2,5-dialkoxy-para-phenylenevinylene) (RO-PPV), cyano-substituted-poly(para-phenylenevinylene) (CN-PPV), poly(2-dimethyloctylsilyl-para-phenylenevinylene) (DMOS-PPV), and poly(2-methoxy, 5-(2-ethylhexyloxy)-para-phenylenevinylene) (MEH-PPV); polythiophene-based compounds such as poly(3-alkylthiophene) (PAT) and poly(oxypropylene)triol (POPT); polyfluorene-based compounds such as poly(9,9-dialkylfluorene) (PDAF), poly(dioctylfluorene-alt-benzothiadiazole) (F8BT), α,ω-bis[N,N'-di(methylphenyl)aminophenyl]-poly[9,9-bis(2-ethylhexyl)fluorene-2,7-diyl] (PF2/6 am4), and poly(9,9-dioctyl-2,7-divinylenefluorenyl-ortho-co(anthracene-9,10-diyl); polyparaphenylene-based compounds such as poly(para-phenylene) (PPP) and poly(1,5-dialkoxy-para-phenylene) (RO-PPP); polycarbazole-based compounds such as poly(N-vinylcarbazole) (PVK); and polysilane-based compounds such as poly(methylphenylsilane) (PMPS), poly(naphthylphenylsilane) (PNPS), and poly(biphenylphenylsilane) (PBPS).

Examples of the low molecular weight light emitting materials or electron transport materials include: various metallic complexes such as 3-coordination iridium complex having, on a ligand, 2,2'-bipyridine-4,4'-dicarboxylic acid, factris(2-phenylpyridine)iridium (Ir(ppy)$_3$), 8-hydroxyquinoline aluminum (Alq$_3$), tris(4-methyl-8-quinolinolate) aluminum(III) (Almq$_3$), 8-hydroxyquinoline zinc (Znq$_2$), (1,10-phenanthroline)-tris-(4,4,4-trifluoro-1-(2-thienyl)-butane-1,3-dionate) europium(III) (Eu(TTA)$_3$(phen)), 2,3,7,8,12,13,17,18-octaethyl-21H, and 23H-porphin platinum(II); benzene-based compounds such as distyrylbenzene (DSB) and diaminodistylrylbenzene (DADSB); naphthalene-based compounds such as naphthalene and Nile red; phenanthrene-based compounds such as phenaenthrene; chrysene-based compounds such as chrysene and 6-nitrochrysene; perylene-based compounds such as perylene and N, N'-bis(2,5-di-t-butylphenyl)-3,4,9,10-perylene-di-carboxylmide (BPPC); coronene-based compounds such as coronene; anthracene-based compounds such as anthracene and bisstyrylanthracene; pyrene-based compounds such as pyrene; pyran-based compounds such as 4-(di-cyanomethylene)-2-methyl-6-(para-dimethylaminostyryl)-4H-pyran (DCM); acridine-based compounds such as acridine; stilbene-based compounds such as stilbene; thiophene-based compounds such as 2,5-dibenzooxazolethiophene; benzooxazole-based compounds such as benzooxazole; benzoimidazole compounds such as benzoimidazole; benzothiazole-based compounds such as 2,2'-(para-phenylenedivinylene)-bisbenzothiazole; butadiene-based compounds such as bistyryl(1,4-diphenyl-1,3-butadiene) and tetraphenylbutadiene; naphthalimide-based compounds such as naphthalimide; coumarin-based compounds such as coumarin; perynone-based compounds such as perynone; oxadiazole-based compounds such as oxadiazole; aldazine-based compounds; cyclopentadiene-based compounds such as 1,2,3,4,5-pentaphenyl-1,3-cyclopentadiene (PPCP); quinacridone-based compounds such as quinacridone and quinacridone red; pyridine-based compounds such as pyrrolopyridine and thiadiazolopyridine; spiro compounds such as 2,2',7,7'-tetraphenyl-9,9'-spirobifluorene; and metallic or non-metallic phthalocyanine-based compounds such as phthalocyanine (H$_2$Pc) and copper phthalocyanine.

Examples of the high molecular weight hole transport material include: polyarylamine, fluorene-arylamine copolymer, fluorene-bithiophene copolymer, poly(N-vinylcarbazole), polyvinylpyrene, polyvinylanthracene, polythiophene, polyalkylthiophene, polyhexylthiophene, poly(p-phenylenevinylene), polyethilene vinylene, pyrene-formaldehyde resin, ethylcarbazole-formaldehyde resin, or any derivative thereof.

The compounds listed above may be used by mixing with other compounds. For an example, a mixed compound containing polythiophene may be poly(3,4-ethylenedioxythiophene/styrenesulfonic acid) (PEDOT/PSS).

Examples of the low molecular weight hole transport material include: arylcycloalkane-based compounds such as 1,1-bis(4-di-para-triaminophenyl)cyclohexane and 1,1'-bis(4-di-para-tolylaminophenyl)-4-phenyl-cyclohexane; diamine-based compounds such as 4,4',4''-trimethyltriphenylamine, N,N,N',N'-tetraphenyl-1,1'-biphenyl-4,4'-diamine, N,N'-diphenyl-N,N'-bis(3-methylphenyl)-1,1'-biphenyl-4,4'-diamine (TPD1), N,N'-diphenyl-N,N'-bis(4-methoxyphenyl)-1,1'-biphenyl-4,4'-diamine (TPD2), N,N,N',N'-tetrakis(4-methoxyphenyl)-1,1'-biphenyl-4,4'-diamine (TPD3), and N,N'-di (1-naphthyl)-N,N'-diphenyl-1,1'-biphenyl-4,4'-diamine (α-NPD); phenylenediamine-based compounds such as N,N,N',N'-tetraphenyl-para-phenylenediamine, N,N,N',N'-tetra(para-tolyl)-para-phenylenediamine, and N,N,N',N'-tetra(meta-tolyl)-meta-phenylenediamine (PDA); carbazole-based compounds such as carbazole, N-isopropylcarbazole, and N-phenylcarbazole; stilbene-based compounds such as stilbene and 4-di-para-tolylaminostilbene; oxazole-based compounds such as $O_xZ$; triphenylmethane-based compounds such as triphenylmethane and m-MTDATA; pyrazoline-based compounds such as 1-phenyl-3-(para-dimethylaminophenyl)pyrazoline; benzine(cyclohexadiene)-based compounds; triazole-based compounds such as triazole; imidazole-based compounds such as imidazole; oxadiazole-based compounds such as 1,3,4-oxadiazole and 2,5-di(4-dimethylaminophenyl)-1,3,4-oxadiazole; anthracene-based compounds such as anthracene and 9-(4-diethylaminostyryl)anthracene; fluorenone-based compounds such as fluorenone, 2,4,7-trinitro-9-fluorenone, and 2,7-bis(2-hydroxy-3-(2-chlorophenylcarbamoyl)-1-naphthylazo) fluorenone; aniline-based compounds such as polyaniline; silane-based compounds; pyrrole-based compounds such as 1,4-dithioketo-3,6-diphenyl-pyrrolo-(3,4-c)pyrrolopyrrole; florene-based compounds such as florene; porphyrin-based compounds such as porphyrin and metal tetraphenylporphyrin; quinacridon-based compounds such as quinacridon; metallic or non-metallic phthalocyanine-based compounds such as phthalocyanine, copper phthalocyanine, tetra(t-butyl) copper phthalocyanine, and iron phthalocyanine; metallic or non-metallic naphthalocyanine-based compounds such as copper naphthalocyanine, vanadyl naphthalocyanine, and monochloro gallium naphthalocyanine; and benzidine-based compounds such as N,N'-di(naphthalene-1-yl)-N,N'-diphenyl-benzidine and N. N,N',N'-tetraphenylbenzidine.

If the organic film layer 11 is to contain the high molecular weight material, the layer 11 may be formed by various coating processes such as spin coating, casting, microgravure coating, gravure coating, bar coating, roll coating, wire-bar coating, dip coating, spray coating, screen printing, flexographic printing, offset printing, and inkjet printing. In a process like spin coating, patterning is conducted through e.g. photolithography after coating the entire surface of a substrate. In a process like inkjet printing, a film can be formed only at a predetermined region by dropping liquid on the region surrounded by partition walls.

Examples of a solvent used in this case include: inorganic solvents such as nitric acid, sulfuric acid, ammonia, hydrogen peroxide, water, carbon disulfide, carbon tetrachloride, and ethylene carbonate; and various organic solvents such as ketone-based solvents such as methyl ethyl ketone (MEK), acetone, diethyl ketone, methyl isobutyl ketone (MIBK), methyl isopropyl ketone (MIPK), and cyclohexanone, alcohol-based solvents such as methanol, ethanol, isopropanol, ethylene glycol, diethylene glycol (DEG), and glycerol, ether-based solvents such as diethyl ether, diisopropyl ether, 1,2-dimethoxy ethane (DME), 1,4-dioxane, tetrahydrofuran (THF), tetrahydropyran (THP), anisole, diethylene glycol dimethyl ether (diglyme), and diethylene glycol ethyl ether (Carbitol), cellosolve-based solvents such as methyl cellosolve, ethyl cellosolve, and phenyl cellosolve, aliphatic hydrocarbon-based solvents such as hexane, pentane, heptane, and cyclohexane, aromatic hydrocarbon-based solvents such as toluene, xylene, and benzene, aromatic heterocyclic compound-based solvents such as pyridine, pyrazine, furan, pyrrole, thiophene, and methylpyrrolidone, amide-based solvents such as N,N-dimethylformamide (DMF) and N,N-dimethylacetamide (DMA), halogen compound-based solvents such as chlorobenzene, dichloromethane, chloroform, and 1,2-dichloroethane, ester-based solvents such as ethyl acetate, methyl acetate, and ethyl formate, sulfur compound-based solvents such as dimethyl sulfoxide (DMSO) and sulfolane, nitrile-based solvents such as acetonitrile, propionitrile, and acrylonitrile, organic acid-based solvents such as formic acid, acetic acid, trichloroacetic acid, and trifluoroacetic acid, and mixed solvents containing these solvents. Among them, nonpolar solvents are preferable, such as aromatic hydrocarbon-based solvents such as xylene, toluene, cyclohexylbenzene, dihydrobenzofuran, trimethylbenzene, and tetramethylbenzene; aromatic heterocyclic compound-based solvents such as pyridine, pyrazine, furan, pyrrole, thiophene, and methylpyrrolidone; and aliphatic hydrocarbon-based solvents such as hexane, pentane, heptane, and cyclohexane. These solvents may be used singly or mixed.

Even if the material contains the high molecular weight material, the following vapor phase film forming process may be used if film formation is possible without accompanying decomposition.

For the low molecular weight material, the vapor phase film forming process such as vacuum vapor deposition may be used. For the combined material, the vapor phase film forming process such as co-deposition is used. If a good thin film is produced by coating without accompanying e.g. crystallization, the aforementioned coating processes may be used. The thickness of the organic film layer 11 is not particularly limited and may be optimized for each type of electronic devices.

Examples of the material constituting the upper metal oxide layer 12 as shown in FIG. 1 include: titanium oxide ($TiO_2$), zinc oxide (ZnO), tungsten oxide ($WO_3$), niobium oxide ($Nb_2O_5$), iron oxide ($Fe_2O_3$), cobalt oxide (CoO), manganese oxide (MnO), tantalum oxide ($Ta_2O_5$), molybdenum oxide ($MoO_3$), vanadium oxide ($V_2O_5$), and ruthenium oxide ($RuO_x$). These materials may be used singly, or two or more of them may be used in combination. The process for forming the upper metal oxide layer 12 is preferably the vacuum vapor deposition that is the vapor phase film formation process. More specifically, the process may be, for example, resistance heating vapor deposition, induction heating vapor deposition, electron beam vapor deposition (EB process), or plasma laser deposition (PLD). Formation of the metal oxide layer on the organic film layer through vacuum vapor deposition gives an interface that allows injection of abundant carriers without depending on the energy level.

By forming the metal oxide layer in vacuum using the vacuum vapor deposition, a slightly reduced film layer, i.e., a metal oxide layer having a dangling bond due to an oxygen defect, is produced. This dangling bond has an effect of fixing the organic substance. As a result, a metallic complex of the BT unit and the metal oxide contained in the organic film layer is produced in the interface between the organic film layer and the metal oxide layer, thereby forming a special functional layer, i.e., a film layer having the Fermi level. Because of the workings of the Fermi level, the injection barrier is lowered, and abundant carriers can be injected independent of the energy level.

Because the function of the upper metal oxide layer 12 is carried out at the layer surface, it is preferable that the film is thin, and the effective thickness starts from 1 nm. It is preferred that the film is about 1 to 100 nm, but not particularly limited thereto.

Figure 2:
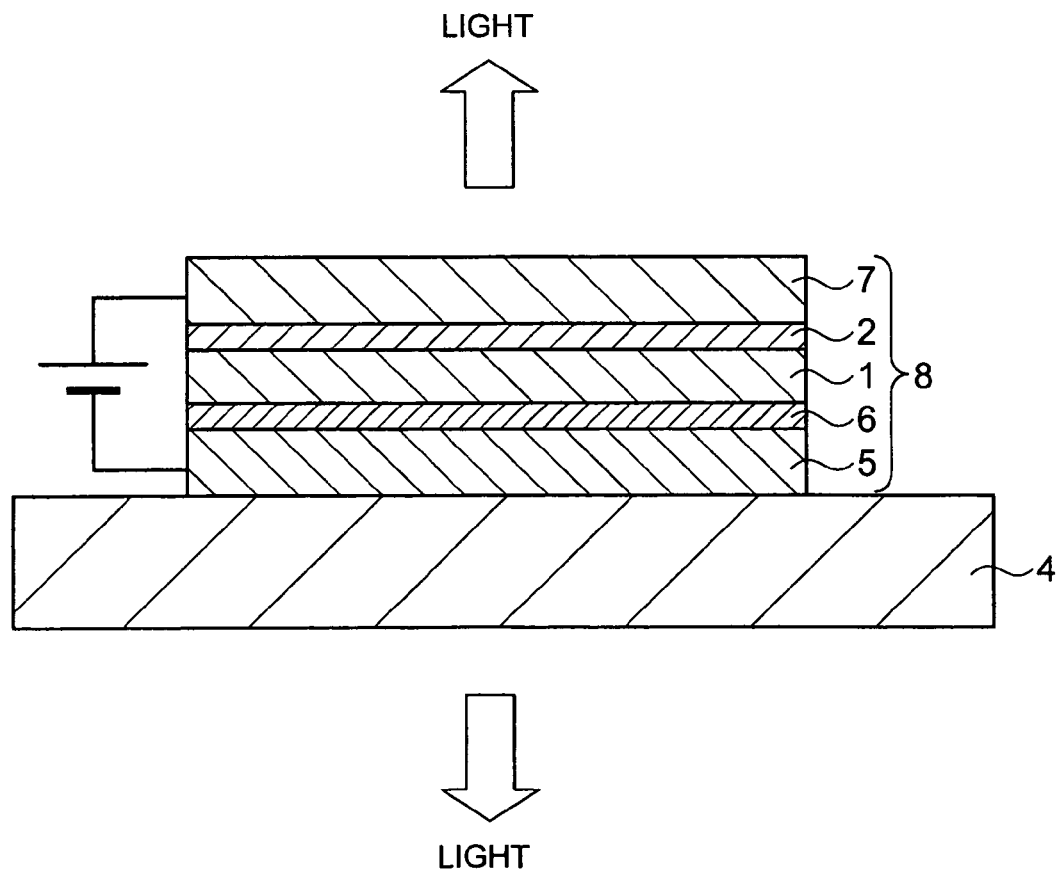
FIG. 2 is a pattern diagram showing the longitudinal plane of an exemplary of a light emitting device having the interface as presented in the embodiments of the invention.

A preferred embodiment of the light emitting device as an actual application of the embodiments of the invention will now be explained with reference to FIG. 2.

EMBODIMENT

A light emitting device 8 as a whole is provided on a substrate 4 and includes: a cathode (one electrode) 5, an anode (the other electrode) 7, an organic film layer 1 interposed between the cathode 5 and the anode 7 (i.e., a pair of electrodes), an upper metal oxide layer 2 provided between the organic film layer 1 and the anode 7, and a lower metal oxide layer 6 provided between the organic film layer 1 and the cathode 5. The lower metal oxide layer 6 is not an essential element of the embodiment of the invention, and the effect of the invention can be produced without the layer 6. In this embodiment, the lower metal oxide layer 6 is included.

The layers mentioned above are provided not on the entire surface of the substrate 4 but in predetermined regions per each device. Therefore, the following film formation process requires a patterning step, unless the formation process is a printing process or the like in which the layers are formed only in predetermined regions. Since the patterning step includes known techniques such as photolithography, not all details of the step will be described.

The substrate 4 is a support for the light emitting device 8 and, also, in this case, a support for the cathode 5 to be produced (film to be formed) directly thereon. Examples of the materials constituting the substrate 4 include: a resin material such as polyethylene terephthalate, polyethylene naphtalate, polypropylene, cycloolefin polymer, polyamide, polyethersulfone, polymethylmethacrylate, polycarbonate, and polyacrylate; and a glass material such as quartz glass and soda glass. These materials may be used singly, or two or more of them may be used in combination. The average thickness of the substrate 4 is preferably, but not limited to, about 0.1 to 30 mm, more preferably about 0.1 to 10 nm.

Unlike a common organic EL device, it is not necessary for the cathode 5 of the present structure to have a low work function. That is, in order to attain stability under the atmosphere, it is possible and even desirable to use a material having a high work function. Other characteristics required are excellent conductivity and transmission. The same is essentially true with the anode 7, in that it is desirable to use a material having a high work function and excellent conductivity.

Examples of the materials constituting the cathode 5 and the anode 7 include: oxides such as indium tin oxide (ITO), indium zinc oxide (IZO), fluorine tin oxide (FTO), $In_3O_3$, $SnO_2$, $SnO_2$ containing Sb, and ZnO containing Al; metals such as Au, Pt, Ag, Cu, and alloys containing these metals. These materials may be used singly, or two or more of them may be used in combination. Another possible material may be a highly conductive poly(3,4-ethylenedioxythiophene/styrenesulfonic acid (PEDOT/PSS).

The average thickness of the cathode 5 is preferably, but not limited to, about 10 to 200 nm, and more preferably about 30 to 150 nm. A non-transmissive material such as Au, Pt, Ag, or Cu can be used for the cathode by setting the average thickness to be about 10 to 30 nm. In contrast, the average thickness of the anode 7 is preferably, but not limited to, about 10 to 10000 nm, and more preferably about 30 to 150 nm.

The organic film layer 1 is a layer to emit light and is a layer containing at least a light emitting material. Therefore, the organic film layer 1 may include a mixture of the light emitting material and the hole transport organic material. Specific materials are as those listed above. The average thickness of the organic film layer 1 is preferably, but not limited to, about 10 to 150 nm, and more preferably about 40 to 100 nm.

The organic film layer 1 transports a hole injected from the upper metal oxide layer 2 and receives an electron from the lower metal oxide layer 6. The hole and the electron are then recombined. The energy discharged in this recombination generates an exciton which discharges (emits) energy (e.g., fluorescence or phosphorescence) when returning to the ground state.

The lower metal oxide layer 6 injects an electron from the cathode 5 and transports the electron to the organic film layer 1. Preferred examples of the material constituting the lower metal oxide layer 6 are those having the high energy level of the conduction band, such as titanium oxide ($TiO_2$), zinc oxide (ZnO), tungsten oxide ($WO_3$), niobium oxide ($Nb_2O_5$), and iron oxide ($Fe_2O_3$) but are not limited thereto. These materials may be used singly, or two or more of them may be used in combination.

Example of the method for forming the lower metal oxide layer 6 include, but not limited to: a chemical vapor deposition (CVD) process that is the vapor phase film forming process such as plasma CVD, thermal CVD, or laser CVD; a dry plating process such as vacuum deposition, sputtering, ion plating, electron bean (EB) deposition, or pulse laser deposition (PLD); a thermal spraying process; a wet plating process that is a liquid phase film forming process such as electrolytic plating, immersion plating, or electroless plating; a sol-gel process; a metallo-organic deposition (MOD) process; a spray pyrolysis process; a doctor blade process using fine particulate dispersion liquid; a spin coating process; an ink jet method; and screen printing such as a printing technique. For the present structure, the spray pyrolysis process is used. The average thickness of the lower metal oxide layer 6 is preferably, but not limited to, about 1 to 1000 nm, and more preferably about 20 to 200 nm.

The upper metal oxide layer 2 injects a hole from the anode 7 and transports the hole to the organic film layer 1. A specific material of the layer 2, among those listed above may be tungsten oxide ($WO_3$), molybdenum oxide ($MoO_3$), vanadium oxide ($V_2O_5$), or ruthenium oxide ($RuO_x$). The layer formation methods are also as those mentioned above. In this case, the layer 2 is formed by the vacuum deposition with resistance heating. The average thickness is preferably about 5 to 50 nm.

Such a light emitting device 8 can be produced as below. Hereafter, the organic film layer 1 containing mainly the high molecular weight material will be described.

First, the substrate 4 is prepared, and the cathode 5 is formed on the substrate 4. The cathode 5 may be formed by using, for example, chemical vapor deposition (CVD) such as plasma CVD, thermal CVD, or laser CVD, dry plating such as vacuum deposition, sputtering, ion plating, or electron beam (EB) deposition, vapor deposition such as thermal spraying, wet plating such as electrolytic plating, immersion plating, or electroless plating, a sol-gel process, a liquid phase film forming process such as MOD, and bonding of a metallic foil. Since it is difficult to apply sputtering to FTO, the CVD process or the spray pyrolysis process is employed.

Then, the lower metal oxide layer 6 is provided on the cathode 5. The lower metal oxide layer 6 may be provided using the aforementioned process like the vapor phase film forming process or the liquid phase film forming process, for example. Suppose that titanium oxide in particular is used for the lower metal oxide layer 6. Although the same effect can be produced using the vapor phase film forming process, use of a simpler spray pyrolysis process of the liquid phase film forming process allows forming film with higher density of the lower metal oxide layer 6 that comes in good contact with the cathode 5. As a result, the effect as previously described becomes more remarkable.

Next, a light emitting organic material is formed as the organic film layer 1 on the upper surface of the lower metal oxide layer 6. Naturally, the hole transport material may also be mixed in the organic material. The formation method of the layer 1 is as described above.

Next, the upper metal oxide layer 2 is formed on the organic film layer 1 by the aforementioned deposition process. The deposition process enables formation of the special functional layer and, as a result, produces the effect as described. The special functional layer mentioned here indicates a layer based on the metallic complex made from the organic compound of the organic film layer 1 and a partially reduced metal of the metal oxide layer 2 and having a flexible energy level. This is the reason why the deposition process is preferable, as the process produces the metal oxide layer having the oxygen defect.

Then, as a final step, the anode 7 is provided on the upper metal oxide layer 2. The anode 7 may be provided by the process such as vacuum deposition, sputtering, or bonding of a metallic foil. Through all these steps, the light emitting device 8 of the embodiment of the invention is produced.

Such a light emitting device 8 may be used as a light source, for example. Also, a plurality of light emitting devices 8 may be arranged in a matrix to compose a display (a display in accordance with the embodiment of the invention).

A system for driving the display is not particularly limited but may be an active matrix system or a passive matrix system.

Described hereinbefore are an essence of the electronic device of the embodiment of the invention and the light emitting device that is the application of the electronic device, based on the embodiments illustrated in the drawings. However, the invention is not limited to these embodiments.

Specific examples of the embodiments of the invention will now be described.

1. Manufacture of Electronic Device (Hole Transport Device for Evaluation)

EXAMPLE 1

In the first step, a transparent glass substrate with an FTO thin film having the thickness of 2.3 mm, available from Hartford Glass, Co., Inc., USA, was prepared. Then, the FTO thin film was etched with zinc powder and 4N hydrochloric acid and patterned to form an FTO electrode (cathode).

Then, in the second step, a molybdenum oxide ($MoO_3$) layer having the average thickness of 5 nm was formed on the FTO thin film as the lower metal oxide layer by vacuum deposition with resistance heating.

Thereafter, in the third step, a polyfluorene derivative ADS133YE available from ADS, Inc. was dissolved in xylene at 1.0 wt %, coated on the $MoO_3$ layer by spin coating (1000 rpm), and then dried. The conditions of drying the liquid material were under the atmosphere and at room temperature (approx. 24° C.). The organic film layer was thereby produced.

Then, in the fourth step, the molybdenum oxide ($MoO_3$) layer having the average thickness of 5 nm was again deposited as the upper metal oxide layer on the organic film layer, and, successively, a gold (Au) layer of the average thickness of 50 nm was deposited as the anode.

EXAMPLE 2

In Example 2, the same steps as in Example 1 were conducted except for the third step. In the third step, a mixture of polyphenylenevinylene derivative ADS100RE available from ADS Inc. and 2,1,3-benzothiadiazole available from Sigma-Aldrich Co. by was dissolved at 1:1 in xylene at 0.8 wt %, coated on the $MoO_3$ layer by spin coating (1000 rpm), and then dried. The conditions of drying the liquid material were under the atmosphere and at room temperature. The organic film layer was thereby produced. The measured thickness of the organic film layer produced under these conditions was an average of 60 nm.

COMPARATIVE EXAMPLE 1

In Comparative Example 1, the same steps as in Example 1 were conducted except for the third step. In the third step, polyphenylenevinylene derivative ADS100RE available from ADS Inc. was dissolved in xylene at 0.5 wt %, coated on the $MoO_3$ layer by spin coating (2000 rpm), and then dried. The conditions of drying the liquid material were under the atmosphere and at room temperature. The organic film layer was thereby produced. The thickness of the film layer was an average of 60 nm.

2. Manufacture of Light Emitting Device

EXAMPLE 3

In Example 3, the same steps as in Example 1 were conducted except for the second step. In the second step, a titanium oxide ($TiO_2$) layer having an average thickness of 100 nm was formed as the lower metal oxide layer on the FTO electrode through the spray pyrolysis process. (Refer to: *Journal of European Ceramic Society* 19, p. 903, 1999 or *Ceramic Trans.* 109, p. 473, 2000). In this example, a diisopropoxybisacetylacetonatotitanium solution and ethanol were mixed at a weight ratio of 1:10 and spray-coated on the FTO substrate that has been heated at 450° C.

COMPARATIVE EXAMPLE 2

In Comparative Example 2, the same steps as in Example 1 were conducted except for the fourth step. In the fourth step, a titanium oxide ($TiO_2$) layer (not a molybdenum oxide layer) having an average thickness of 100 nm was formed as the upper metal oxide layer on the organic film layer by coating fine particulate dispersion liquid. The fine particulate dispersion liquid used here contains titania particulates ST1 available from Ishihara Sangyo Kaisha, Ltd., ethyl cellulose as the binder, and ethanol and terpineol as the solvent. Similarly to Example 1, a gold (Au) layer having an average thickness of 50 nm is deposited as the anode on the titanium oxide ($TiO_2$) layer.

3. Evaluation

Figure 3:
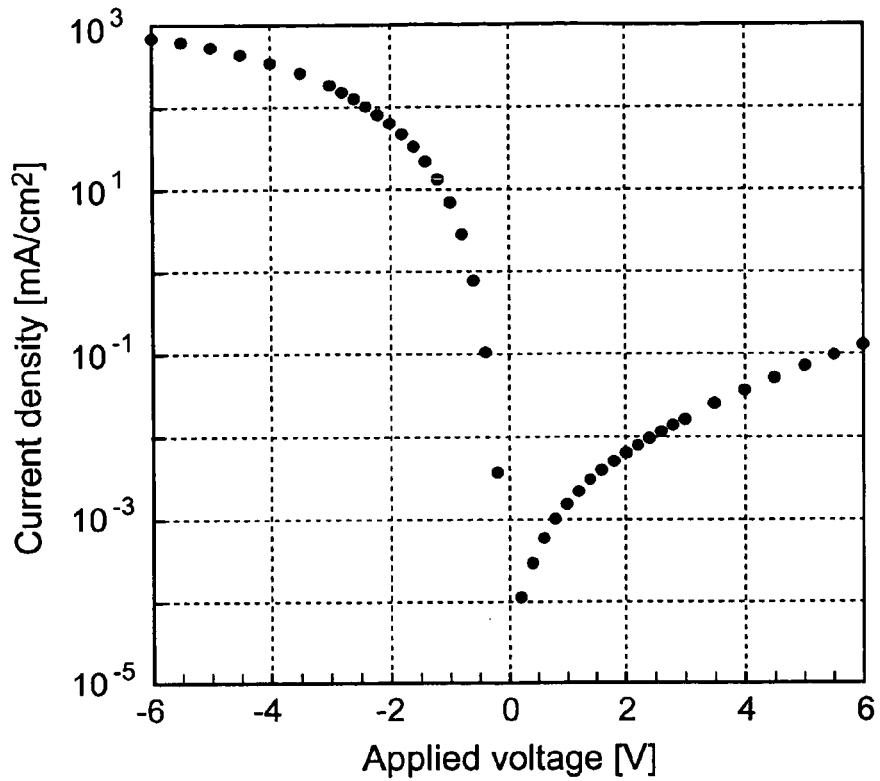
FIG. 3 is a graph showing results of evaluation of the current-voltage characteristics of an electronic device produced in Example 1.
Figure 4:
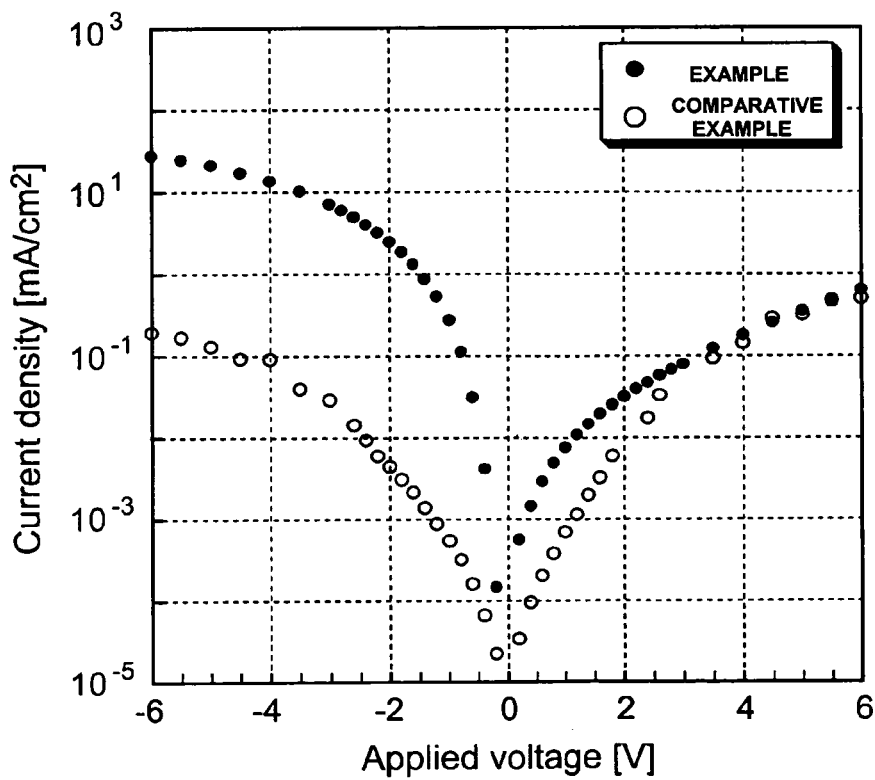
FIG. 4 is a graph showing results of evaluations of the current-voltage characteristics of electronic devices produced in Example 2 and Comparative Example 1.
Figure 5:
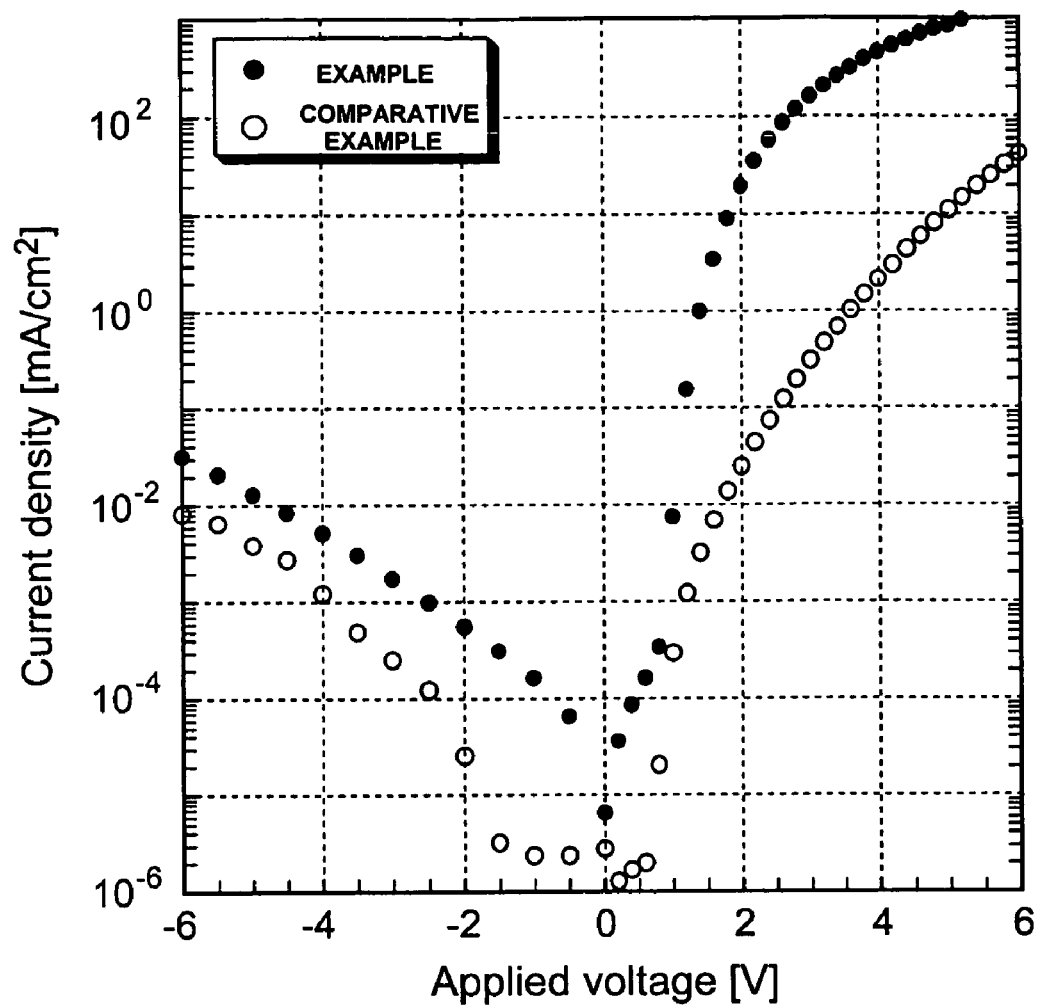
FIG. 5 is a graph showing results of evaluations of the current-voltage characteristics of the electronic devices produced in Example 3 and Comparative Example 2.

The current-voltage characteristics of each of the devices produced in the above Examples and Comparative Examples were evaluated. The results are illustrated in FIG. 3 through FIG. 5. With the device of Example 1 referring to FIG. 3, asymmetry of as many as four orders of current density under 6V was shown as a result of abundant carrier injection from the upper metal oxide layer, despite that the device was structurally completely symmetrical.

From the current-voltage characteristics of Comparative Example 1 shown in FIG. 4, in which a different material was used only in the third step, it is clear that the current-voltage characteristics are dependent on the constituting material of the organic film layer. From the asymmetrical current-voltage characteristics of Example 2 as shown in FIG. 4 and the current-voltage characteristics of Example 1 as shown in FIG. 3, it can be confirmed that formation of the complex of the BT unit and the metal in the metal oxide under the reducing environment has produced a new energy state.

Also, by Example 3 and Comparative Example 2, the abundant carrier injection was confirmed as the characteristics of the light emitting device. The results of these examples are shown in FIG. 5. The devices of Example 3 and Comparative Example 2 have substantially a similar structure, differing only in the order of layers stacked. It is in Example 3 that the abundant carrier injection as shown in FIG. 3 was present. In Example 3, clear diode characteristics were shown, and light emission was in fact observed from around 2V. In contrast, Comparative Example 2 with the different layer stacking order did not show satisfactory diode characteristics, and light emission was observed only at 7V. From these results, it is confirmed that it is possible with the interface according to the embodiments of the invention to use a stable metal as the electrode that does not depend on the energy level of the central organic material and, at the same time, to produce the light emitting device with low threshold voltage.

What is claimed is:

1. An organic electronic device, comprising:
    a pair of electrodes;
    an organic film layer containing an organic substance having a benzothiadiazole skeleton;
    a metal oxide layer provided on the organic film layer by vacuum vapor deposition; and
    an interface layer formed between the organic film layer and the metal oxide layer, the interface layer comprising reduced metal oxide molecules that form metallic complexes with the benzothiadiazole skeleton.

2. The organic electronic device according to claim 1, the metal oxide being a molybdenum oxide.

3. The organic electronic device according to claim 1, the metal oxide being a vanadium oxide.

4. The organic electronic device according to claim 1, the organic electronic device being an organic film light emitting device.

5. A method for manufacturing an organic electronic device, comprising:
    providing a first film layer made of an organic substance having a benzothiadiazole skeleton;
    providing on the first film layer a second film layer made of a metal oxide by vacuum vapor deposition; and
    forming an interface layer between the first film layer and the second film layer, the interface layer comprising reduced metal oxide molecules that form metallic complexes with the benzothiadiazole skeleton.

6. The method for manufacturing an organic electronic device according to claim 5, the metal oxide being a vanadium oxide.

7. The method for manufacturing an organic electronic device according to claim 5, the metal oxide being a molybdenum oxide.

8. The method for manufacturing an organic electronic device according to claim 5, further comprising providing below the first film layer a third film layer made of a metal oxide.

9. The method for manufacturing an organic electronic device according to claim 8, wherein the third film layer is provided by a spray pyrolysis process.

10. The organic electronic device according to claim 1, further comprising a second metal oxide layer, the organic film layer provided on the second metal oxide layer.

11. The organic electronic device according to claim 10, wherein the second metal oxide layer is provided by a spray pyrolysis process.

* * * * *